United States Patent [19]
Haynie et al.

[11] Patent Number: 5,149,934
[45] Date of Patent: Sep. 22, 1992

[54] HIGH VOLTAGE ELECTRON BEAM GUN

[75] Inventors: Timothy J. Haynie, Hickory Hills; Glen S. Lawrence, Naperville, both of Ill.

[73] Assignee: Ferranti Sciaky, Inc., Chicago, Ill.

[21] Appl. No.: 764,844

[22] Filed: Sep. 24, 1991

[51] Int. Cl.$^5$ .............................................. B23K 15/00
[52] U.S. Cl. ................................................ 219/121.27
[58] Field of Search ..................... 219/121.13, 121.14, 219/121.20, 121.18, 121.19, 121.27

[56] References Cited

U.S. PATENT DOCUMENTS 4,687,902  8/1987  Colegrove et al. ............ 219/121.27
4,998,004  3/1991  Lawrence et al. ............. 219/121.13

Primary Examiner—C. L. Albritton

[57] ABSTRACT

An electron beam gun for operation from 100 to 200 kilovolts which includes means for maintaining the alignment and spacing of critical gun elements over the wide range of temperatures experienced during operation of the gun and which allows for ease in changing filaments and ease in dismantling the gun for servicing. Means are provided for the safe handling of the gun when this is requires while the gun is mounted on a machine. The gun is provided with a novel filament and cathode support cartridge assembly of simple design. A quick access door assembly allows quick and easy access to the guns internal parts and insures positive vacuum sealing.

10 Claims, 6 Drawing Sheets

HIGH VOLTAGE ELECTRON BEAM GUN

This invention relates to electron beam generating devices utilized in electron beam machines for the purpose of welding, cutting, hole drilling or heat treating of materials, and has reference specifically to electron beam guns operating at high voltages ranging, for example, from 100 to 200 kilovolts, which are externally mounted on a vacuum chamber in which the above processes are carried out by directing an electron beam generated in electron gun to the workpieces being processed within the chamber. The electron beam gun consists essentially of a replaceable tungsten filament which is held by a suitable filament holder, a cathode electrode, and an anode electrode supported at a specific distance from the cathode. A power supply furnishes current to the filament in order to heat it to its electron emission temperature and provides also the necessary potential between anode and cathode to accelerate the electrons emitted by the filament towards the anode and through an opening in the anode towards the work to be welded or cut or heat treated as the work is struck by the concentrated beam of electrons traveling at speeds approaching the speed of light.

Heretofore high-voltage guns have suffered from defects or deficiencies and inconveniences in their use because of:

1. Loss of alignment of critical elements in the electron beam generating system.
2. Ineffective or poor radiation shielding means which made it necessary to add radiation shielding materials to the vacuum chambers associated with the electron gun.
3. Difficulties in the assembly of the gun.
4. Difficulty in changing filaments.
5. Inadequate or no means for preventing an operator of the machine or a repairman from coming in contact with high voltage.
6. Awkward arrangement of elements.
7. Difficulty of dismantling gun for servicing.
8. Changes in electron beam current during operation of gun due to changes in spacing of gun elements resulting from temperature changes of element supports.
9. Susceptibility to external magnetic influences.

The object of this invention is to provide a stable and safe electron beam gun capable of operating safely at voltages of 100 to 200 kilovolts.

A further object is to provide a gun which may be readily produced by ordinary production methods.

A further object is to achieve a simple, machinable housing that maximizes the alignment of the gun components but requires no welding or casting, and eliminates the need for secondary addition of radiation shielding materials.

A further object is to produce an electron gun which is mechanically and electrically stable in operation.

Another object is to produce an electron gun by which an electron beam is generated which is stable and unchanging at any output current level to which it is set.

Another object is to provide an electron gun in which the filament is easily replaced without the use of special tools.

Another object is to provide a gun which does not require dismantling in order to replace a filament.

Another object is to provide a gun which is shielded form external magnetic fields.

Another object is to provide means on the gun to allow safe handling of the gun while mounted in the machine.

Another object is to provide a filament and cathode support cartridge assembly in which the components that are utilized have only simple shapes which are easily machined and which can easily be accurately aligned.

Another object is to provide an electron gun in which the biasing electrode to filament spacing is stable.

Another object is to provide an electron gun having a simplified filament holder assembly.

Another object is to provide an electron beam gun with a shorting mechanism assembly to automatically ground the cartridge head prior to the operator touching the cartridge with his hand so as to prevent accidental exposure of the operator to electrical shock.

Another object is to provide a quick access door assembly which allows quick and easy access to the gun internal parts while insuring positive vacuum sealing and radiation shielding.

With these and various other objects in view, the invention may consist of certain novel features of construction and operation as will be more fully described and particularly pointed out in the specification, drawings and claims appended hereto.

In the drawings which illustrate an embodiment of the device and wherein like reference characters are used to designate like parts, FIG. 1 is a side view of an electron beam gun embodying the improvements of the invention and FIG. 2 is a top view of the gun from its position as viewed in FIG. 1. The part marked (2) is a pumping manifold which may be bolted to the gun housing (1) at any one of 3 positions so that the extension (15) to the manifold and the pumping means (14) may be in the position as shown in FIGS. (1) and (2) or in a position 180 degrees from the door as shown in FIG. 3 or in a position 90 degrees to the left of the door.

Figure 1:
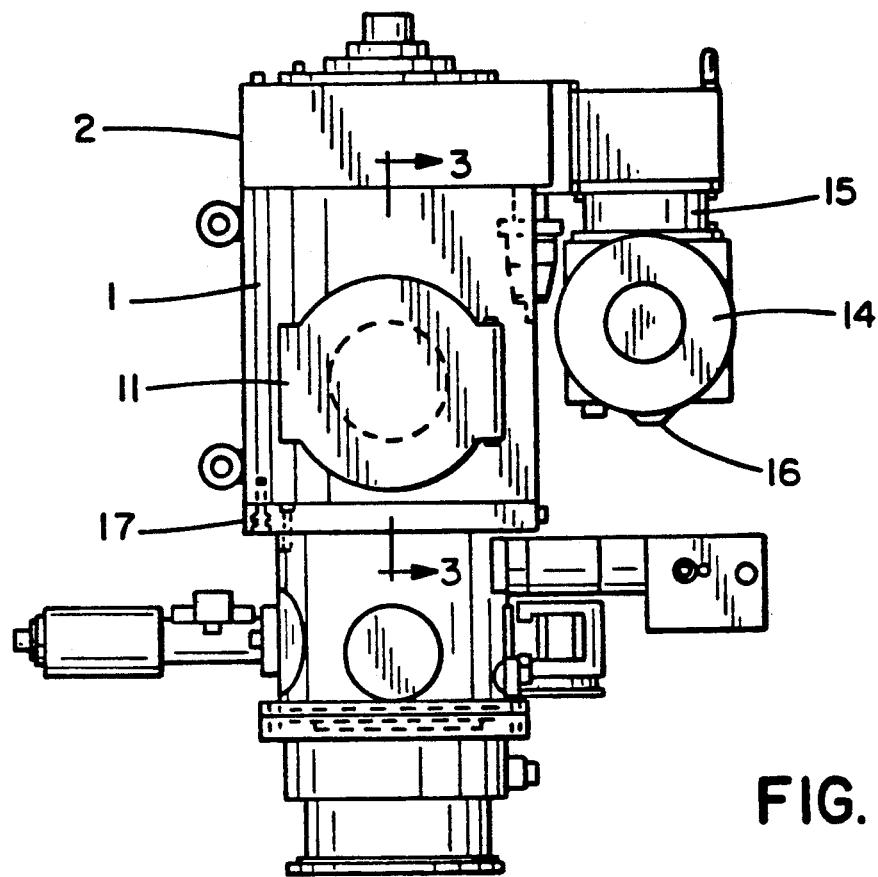
Figure 2:
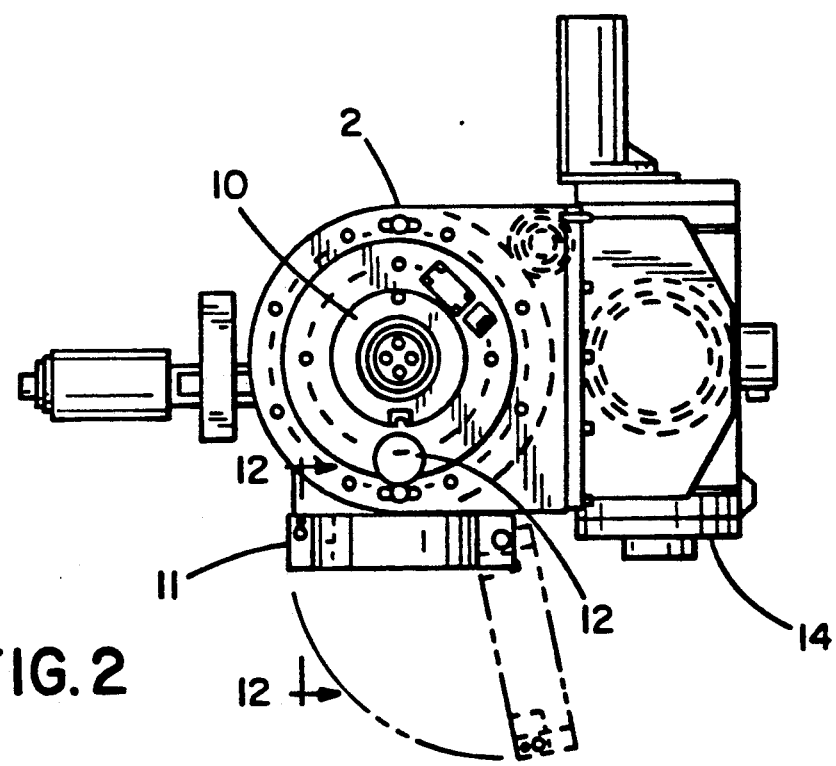
Figure 3:
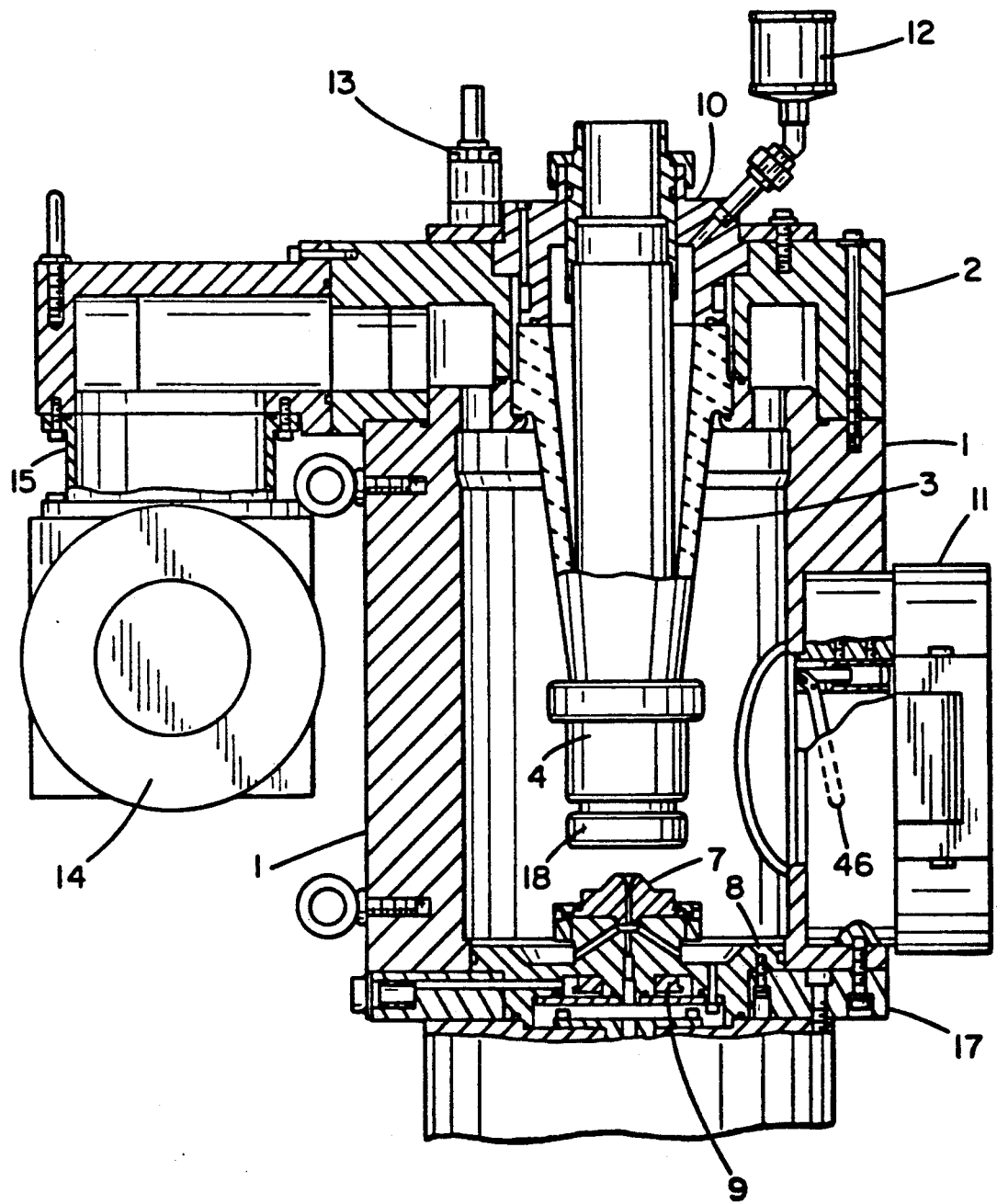
FIG. 3 shows details of the high voltage gun assembly as viewed at Section 3—3 of FIG. 1 [but with the extension (15) to the pumping manifold in a position 180 degrees from the door.]

Referring now to FIG. 3, we note that the gun housing (1) is constructed of a thick steel cylinder approximately three inches in thickness. This thickness of steel provides adequate radiation shielding for 150-kilovolt x-rays when welding at a power of 15 kilowatts. The use of thick sections for the gun housing results in a production cost of the finished gun chamber which is much lower than the cost of thin walled gun chambers to which radiation shielding material such as lead must be added.

Figure 4:
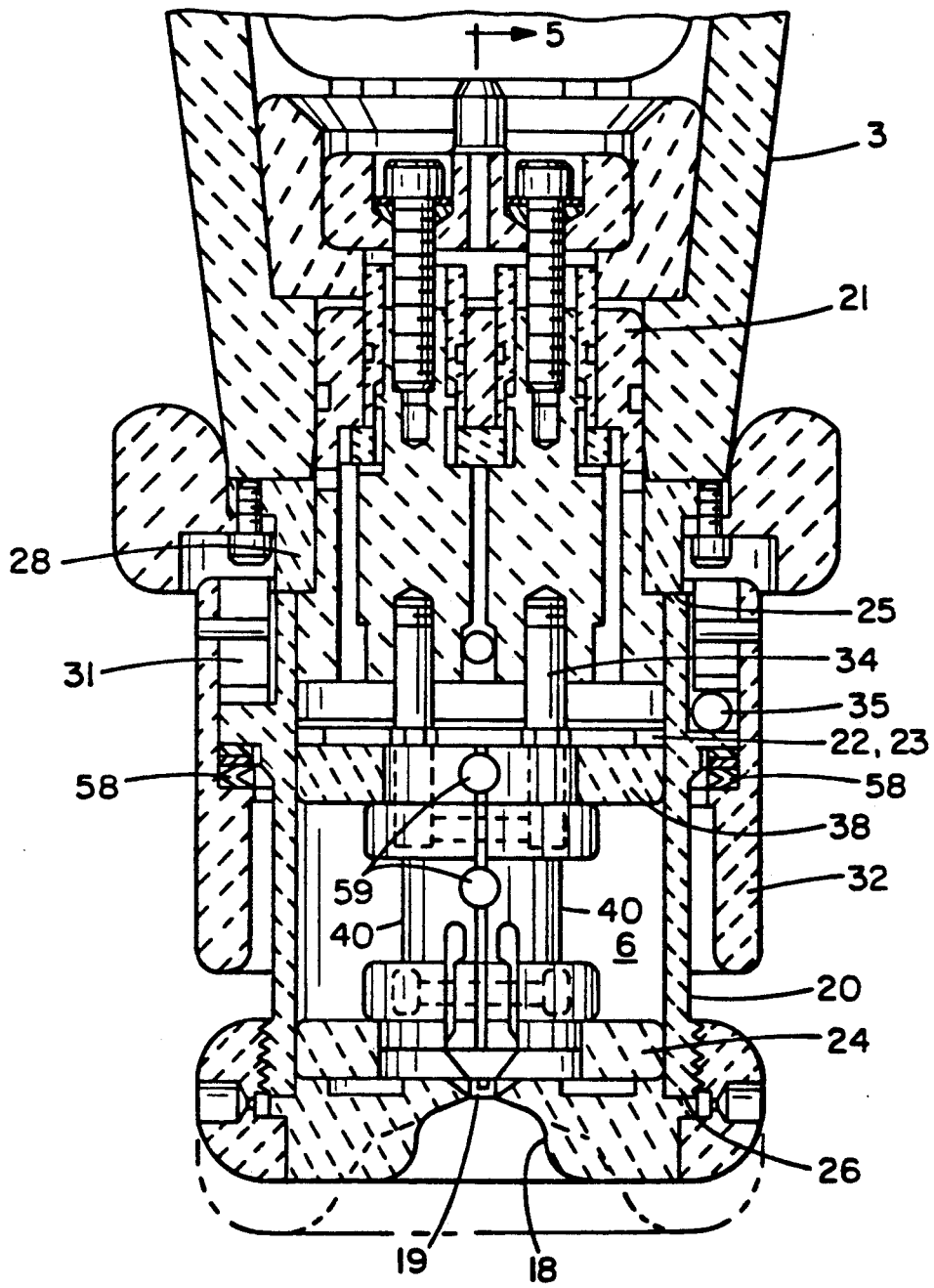
FIG. 4 shows details of the cartridge head assembly which includes the cathode of the gun.
Figure 4:
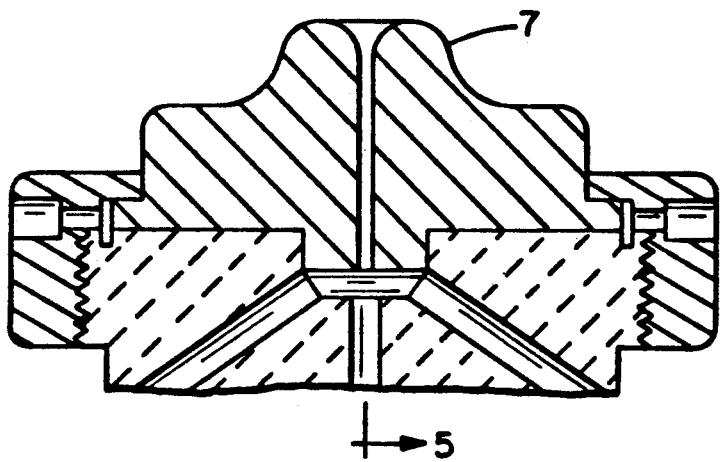

The gun assembly of FIG. 3 comprises a gun housing (1), a pumping manifold (2) mounted above the gun housing, an extension (15) to the manifold, a cathode insulator (3), a cartridge head assembly (4) FIG. 4 supporting a control electrode (18) and a filament holder assembly (6), an anode (7) and anode mount assembly (8), an alignment coil (9) for aligning the electron beam, pumping means (14), for evacuating the gun, mounted on the pumping manifold, a receptacle (10) for supporting the means for applying current to the filament, a door assembly (11), means for supplying oil to the interior of the cathode insulator (12), and safety switch means (13).

The body of the gun (1), being at closest proximity to the anode and cathode, is constructed of three-inch thick metal to provide adequate absorption of the energy from the "X" radiation produced by the electrical discharge between filament and anode during the operation of the gun.

The pumping manifold (2) may be constructed of thinner sections (for example, two-inch steel), inasmuch as the pumping manifold is at a considerable distance from the source of x-rays. A turbomolecular pump (14) is mounted below the manifold extension (15) at an orientation such that there is no direct line of sight between the pump discharge port (16) and the radiation source. This prohibits the direct passage of high-energy x-rays through the pump. Any radiation that is present in the pump area is of a much lower energy since it is secondary emission produced by an absorption re-radiation mechanism.

The gun housing (1) is of a simple cylindrical shape, easily machined from bar or tube. The heavy walls permit the mounting of the access door assembly (11), an anode adapter ring (17), the anode mount (8), and the pumping manifold (2) without the addition of mounting flanges. The mild steel body, while serving as an x-ray radiation shield, also serves to protect the electron beam from external magnetic fields. Non-magnetic material is utilized to support the anode (7) in the anode mount in order to avoid the possibility of problems that would result from the anode mount being magnetized. The use of the thick walled gun housing also allows one to machine pilot the diameters and reference surfaces for both the cathode insulator and anode mount into the one-piece gun housing, thereby achieving accurate alignment of the electron gun components. The thick walled structure provides excellent x-radiation shielding, vacuum containment, magnetic shielding, mounting surfaces without the addition of welded flanges, and accurate alignment with a single, simple machined component.

Figure 5:
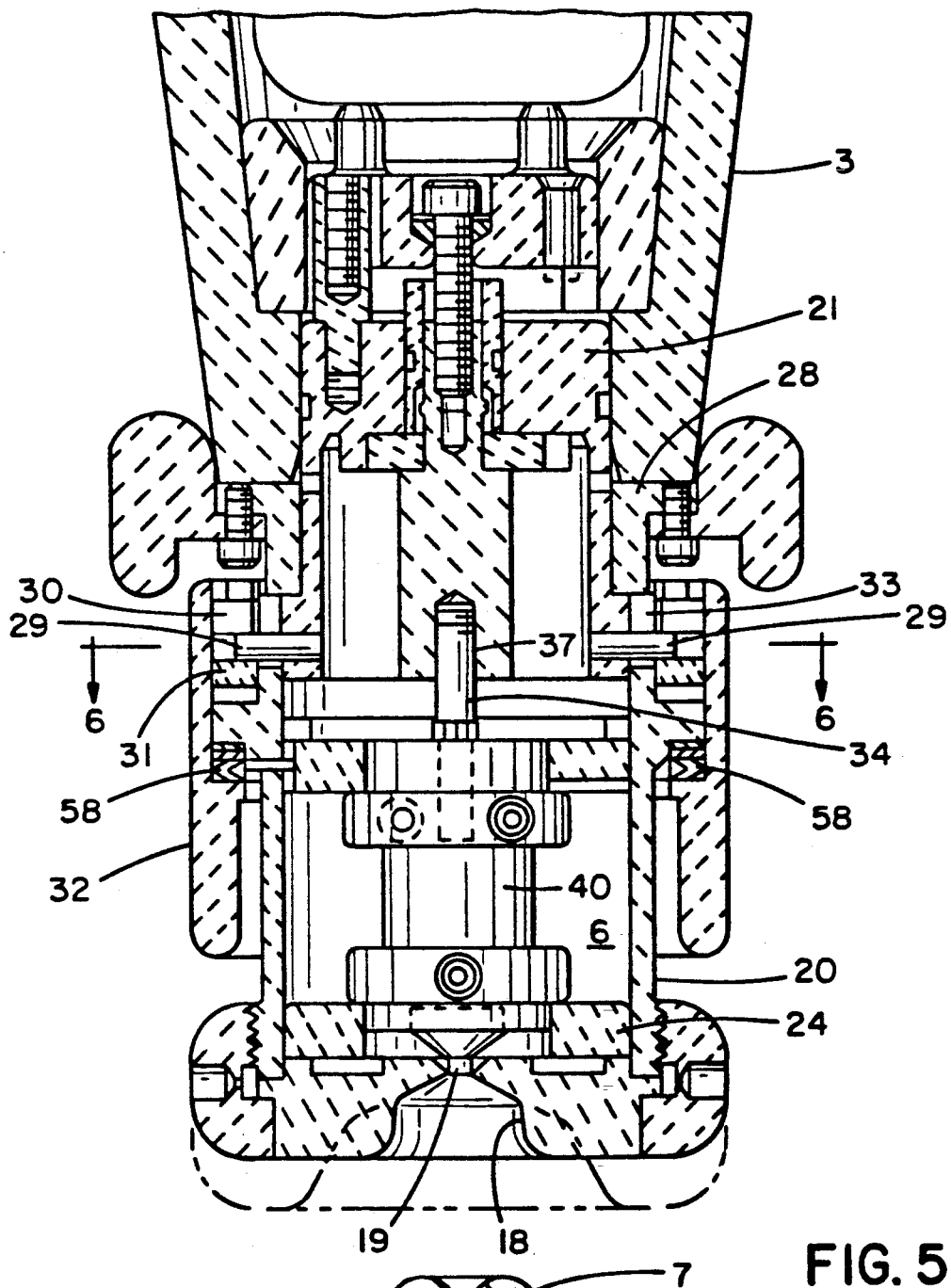
FIG. 5 is a view of FIG. 4 rotated 90°.
Figure 5:
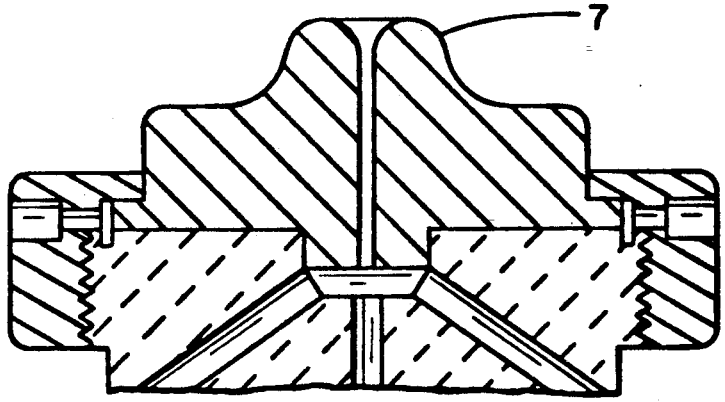

FIGS. 4 and 5 illustrate in detail the cartridge head assembly design. The cartridge head assembly supports the control electrode (18) of the gun and the filament (19) which serves as the source of electrons when it is heated to the emission temperature. The cartridge body (20) is machined from a tube so that the inside surface is true cylinder. This inner cylindrical surface pilots the critical components of the cathode. At the top of the cylinder, the cartridge body (20) pilots directly onto the cartridge feedthrough (21). Partway down the cylinder, a retaining ring (22) held in a groove, forms a shoulder against which a wavespring (23) is loaded. The use of the retaining ring rather than machining in a shoulder allows the bore of the cylinder to be held to a very tight tolerance with full assurance of concentricity from top to bottom. At the bottom of the cylinder, the control electrode (18), which is also referred to as the bias electrode, and the cathode spacer (24) are piloted. The ends (25), (26) of the cartridge body are machined such that they are perpendicular to the cylindrical bore and parallel to each other. These surfaces are the reference planes which set the spacing of the control electrode (18) with respect to the anode (7). Due to the simple geometry of these parts, high precision is easily achieved.

Figure 6:
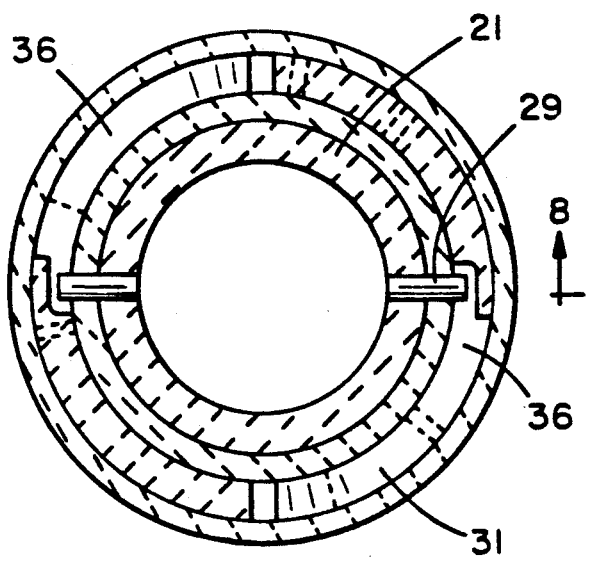
FIG. 6 is a section of FIG. 5 at 6—6.
Figure 7:
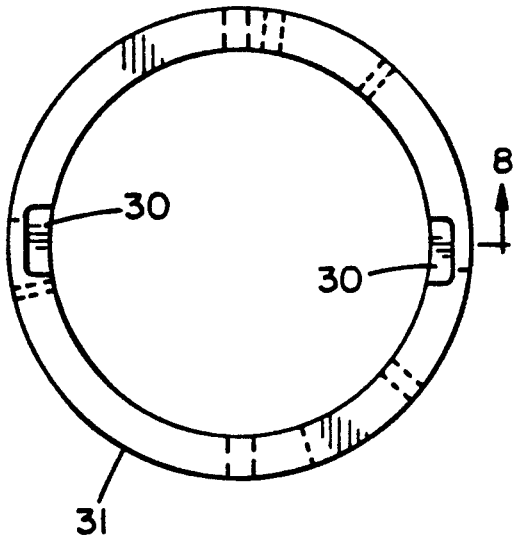
FIGS. 7 and 8 are sections of the linear cam which is a part of the cartridge head assembly.
Figure 8:
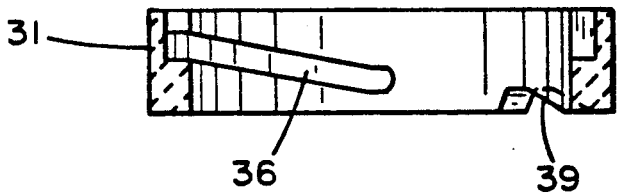

Incorporated into the design is a unique quick-release mechanism for the cartridge head which supports the control electrode and the filament holder (6) so as to allow for quick and easy access to the filament (19) without the use of tools. This mechanism is used to hold the cartridge head assembly securely against a reference surface on the collar (28) at the end of the cathode insulator (3). To accomplish this, the mechanism engages a pair of hardened steel pins (29), of FIG. 6 which extend from the sides of the cartridge feedthrough (21) which is mounted on the cathode insulator (3). On installing the cartridge into the gun, these pins initially line up with recesses (30) in a linear cam (31), as shown on FIG. 7, which is permanently attached to the cover ring (32). The cartridge feedthrough (21) is generously chamfered to allow the cartridge head assembly to be installed with little initial resistance. The cartridge body (20) has clearance slots (33) which correspond to the location of the hardened pins mentioned above. The angular location of the filament current contact pins (34) is indexed to the location of these slots such that when the slots in the body clear the hardened pins, the filament current pins (34) automatically line up with their corresponding sockets (37), allowing easy initial insertion.

When the cartridge head assembly has been partially installed onto the cartridge feedthrough, some resistance is encountered as the body reaches the end of the tapered lead-in and the filament pins begin to contact the compliant bands within the sockets. At this point the cover ring (32) may be rotated, causing three steel balls (35) to roll up three respective ramps (39) in the cam (31), causing the cam to lift out of the indexing notch and compress the wavespring (58) which preloads the cartridge body (20) against the balls. Further rotation of the cover ring (32) causes the cartridge head assembly to be drawn up onto the cartridge feedthrough assembly (21) by means of two spirally shaped slots (36) in the cam (31), each of which engages one of the hardened steel pins (29) previously mentioned.

When the cartridge body has been drawn up to the point at which it contacts the reference surface (25) of the collar, further turning of the cover ring (32) of the cartridge head assembly allows the cam (31) to lift off of the balls, further compressing the wavespring (58). Then at the end of the cam travel, the hardened pins drop into a detent in the cam, locking the head assembly into place. The operator will feel the pins "click" into place and can be assured that the head assembly is properly positioned.

The total required travel for the cover ring (32) is approximately one-quarter of a turn. To remove the cartridge, the operator simply turns the cover ring in the opposite direction, and the assembly is driven off of the feedthrough by means of the pins riding on the lower portion of the spiral cam.

Figure 9:
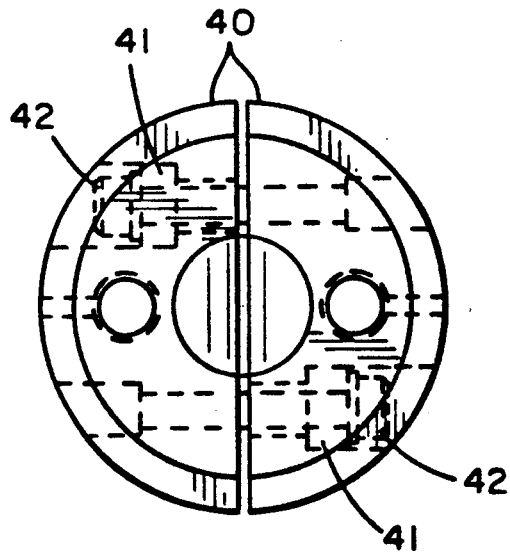
FIGS. 9 and 10 are the top view and side view respectively of the filament holder assembly.
Figure 10:
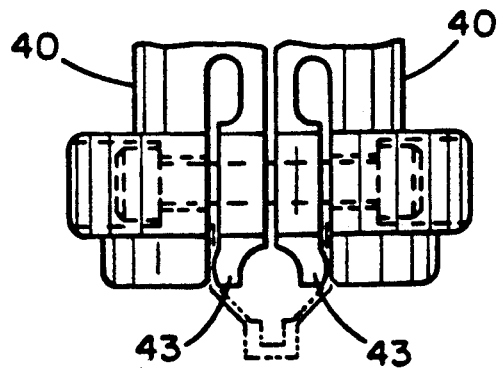

One of the major problems encountered in using electron beam guns is the variations in operating characteristics which occur as the components in the gun heat up. This has been a very serious problem in previously designed guns, and this problem has been cured by including into the design of the gun a unique thermally stable bias electrode to filament spacing means. In the new gun, the bias electrode is piloted directly in the cartridge body. A ceramic cathode spacer (24) pilots directly in the same bore. This spacer is precision ground on the ID, OD, top and bottom. The filament holder (6) pilots within this spacer (24) directly, thus eliminating the need for a line-up tool for installing the filament holder while minimizing the number of precision parts involved. The spacer sits upon a reference surface on the back surface of the bias electrode, while the filament holders sit directly upon the back of the spacer. This arrangement sets the filament to cathode (bias electrode) spacing accurately, with a minimum of tolerance accumulation. This arrangement also serves another highly important function, in that the bias electrode to filament spacing is not sensitive to temperature variations within the cartridge. This overcomes a deficiency in previous designs in which the filament holder and cartridge body are attached to fixed plane at the top of the filament holder assembly. Since the filament must be heated to a relatively high temperature to emit electrons, and since much of the filament heat is conducted into the filament holder, the thermal growth of the filament holder assembly is quite large. Since there is relatively little heat radiated to the cartridge body, its thermal growth is much smaller. In previous designs, the net affect of differential growth was to change the filament to bias electrode spacing. This would result in a change in gun characteristics as the gun warmed up to equilibrium operating temperature. In this new design, since the filament holder is held against a ceramic spacer (24) which sits on the back side of the bias electrode (18), the only spacing change is due to the expansion of the ceramic spacer. This expansion is minimal, since the spacer is quite thin (approximately 0.375") and since the material used has an extremely low thermal expansion coefficient. The upper end of the filament holder is held in position with a second ceramic spacing ring (38). This spacing ring is loaded against the filament holder by means of a wavespring (23). When the filament holder (6) grows by thermal expansion, the upper ceramic spacer (38) is free to move within the cartridge body, compressing the wavespring. The diameter of the filament holder in the area of the upper spacer is such that there is sufficient clearance to allow for radial thermal growth of the filament holder without cracking the ceramic spacer. The filament holder may also be made of a material such as Invar which has a low coefficient of thermal expansion. At the bottom of the filament holder, where the positioning is critical, a precision pilot is necessary. In this area, the slots in the lower portion of the filament holder are sufficient to take up the radial thermal growth. The new electron gun includes a simplified filament holder assembly (6) comprising two main halves (40) which may be conveniently machined together as a stepped cylinder. The two halves (40) are assembled as shown in FIGS. 9 and 10 and electrically insulated from one another by means of two insulating sleeve washers (41). The filament is installed as indicated and clamped in position by tightening screws (42), which deflect the complaint inner portion (43) of the filament clamps so as to secure the filament in place and provide good electrical connections between holder and filament.

The opposite end of the holder is provided with contact pins (34) for connection to a source of filament current. This new type of filament holder has several advantages over previous designs. Older designs have utilized several separate pieces for the filament holder legs (e.g., clamps, springs and backing clamps). The new design utilizes fewer parts and allows the overall size of the holder to be reduced, which also results in a lower cost of production. The new holder also allows for a design which is in cylindrical form to better withstand the high-voltage stress.

Safety Provision

Figure 11:
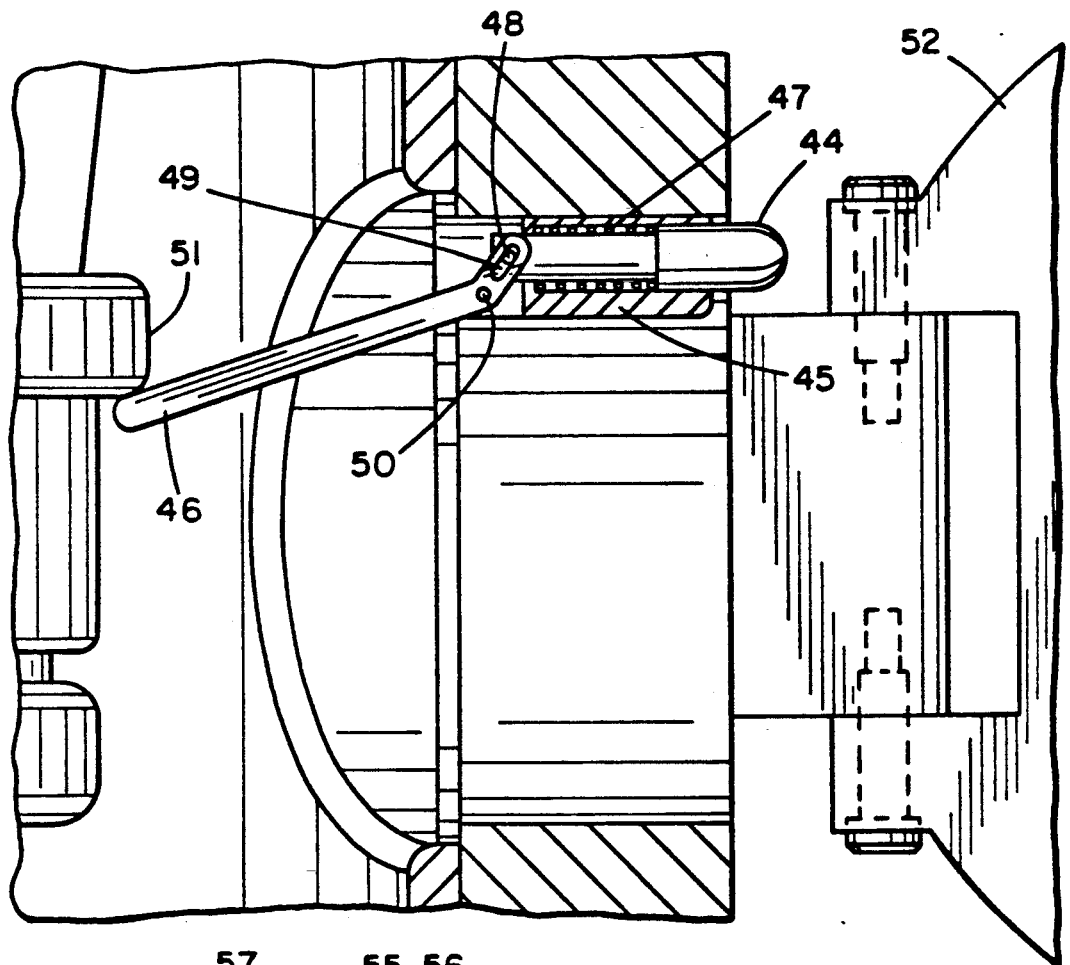
FIG. 11 shows details of a shorting mechanical assembly which is brought into play whenever the internal gun parts, normally at high voltage, are to be removed or examined.

The new gun is furnished with a safety device shown in FIG. 11 which automatically grounds the cartridge head whenever it is necessary for the operator to handle the cartridge for removal or insertion, or for the replacement of a filament. The shorting mechanism consists of a plunger (44), a body (45), a shorting arm (46) and a spring (47), as well as miscellaneous hardware. The shorting mechanism operates in the following manner:

When the operator opens the access door (52) the plunger (44), normally in a retracted position inside the body, is extended by means of the spring (47). At the end of the plunger furthest from the door, a pin (48) is mounted which engages a slot (49) in the shorting arm (46). When the plunger extends, the pin (48) causes the shorting arm to rotate about a pivot (50), move towards the cartridge assembly and contact the corona ring (51) at the end of the cathode insulator, thus effectively grounding the gun assembly. When the door is closed, it pushes the plunger back into the body and the shorting arm is retracted. In the retracted position, the entire mechanism is well recessed into the door port, which is at ground potential. The mechanism is therefore removed from the high-voltage stress area when the gun is in operation.

Figure 12:
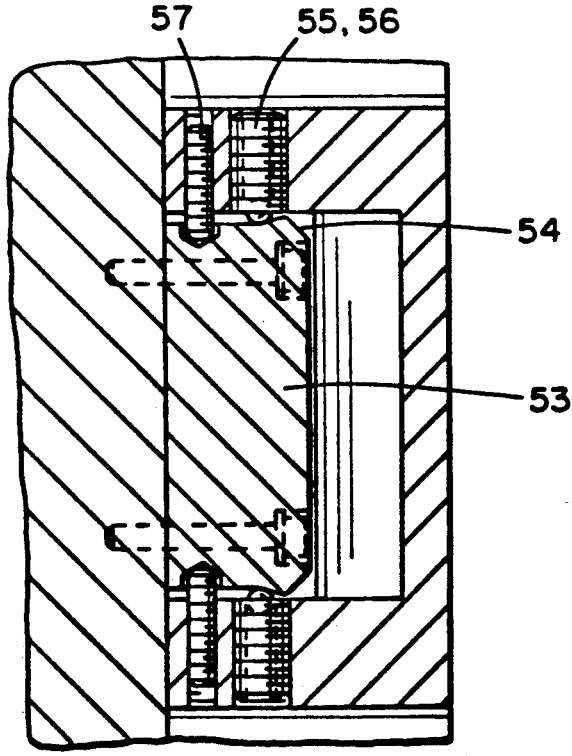
FIG. 12 illustrates a feature of the door assembly through which gun parts such as the anode and cathode holder may be removed for examination or replacement.

FIG. 12 illustrates a detail of the door handle and latching mechanism. The latching mechanism consists of a latch block (53) fastened to a door mounting ring which is attached to the gun body and two spring (55) and plunger (56) detents mounted behind the handle area, one, at the top and the second at the bottom, of the handle area. The latch block is machined so as to provide 2 ramps (54) with which the spring and plunger detents make contact when the door is being closed. On closing the door the ball (59) attached to the end of each plunger rides up the ramp compressing the spring against which the plunger acts. At the top of the ramp the detent spring force reaches a maximum. Beyond this point the ball end of the detent starts to ride down a second ramp area where the spring force assists in urging the door to close. Before the ball reaches the bottom of the ramp the door makes contact with an o-ring seal which encircles the opening in the chamber. The force of the detent against the ramp serves to keep the door in the closed position. The spring force is not great enough to fully compress the o-ring but is sufficient to keep the door against the o-ring seal until the roughing vacuum pumps have reduced the pressure within the gun housing to less than the atmospheric pressure. At this point the differential pressure acting on the door assists in compressing the o-ring seal. At an internal pressure of approximately 1 TORR, the seal is fully compressed and pumping can continue until the low pressure required for proper operations of the electron gun is reached.

An additional feature of the door assembly is presence of integral locking screws (det. 14) which can be used to secure the door to the latch block for shipping or handling. These screws are not used during the normal operation of the machine since differential pressure keeps the door closed. However, when the chamber is vented, the detent latch arrangement does not positively secure the door in the closed position. The locking screws are threaded through the door in the area of the spring detents. When the door is closed, these screws may be tightened into receiving pockets in the latch block, thereby positively securing the door.

The invention is not to be limited to or by details of construction of the particular embodiment thereof illustrated by the drawings, as various other forms of the device will of course be apparent to those skilled in the art without departing from the spirit of the invention or the scope of the claims.

What we claim is:

1. An electron beam gun for operation at voltages from 100 to 200 kilovolts comprising; a cylindrical gun housing, (1) a pumping manifold mounted above the said gun housing, a hollow elongated cylindrical insulator (3) supported at one end by said pumping manifold concentrically within said gun housing, a cartridge feed-through (21) mounted at the opposite end of said insulator, a cartridge head assembly mounted within the said cartridge feed-through, the said head assembly consisting of a filament holder assembly (6) which includes a cathode electrode (18) insulated from a filament holder (40) and means (34) for connecting said filament holder to terminals (37) on the said cartridge head assembly, an anode mount supporting an anode (7) in close proximity to the said cathode electrode; an alignment coil supported below the anode, means including a receptacle for supplying electric current to the filament, means for supplying to and retaining oil within the cathode insulator, pumping means, (14) for evacuating the gun, mounted on the pumping manifold, safety switch means for grounding the gun parts to the housing and an access door assembly mounted on said housing.

2. In an electron gun as in claim 1, capable of generating an electron beam which is directed to impinge upon a given point on a workpiece; a gun housing having a thickness of approximately 3 inches, a pumping manifold mounted above the said gun housing, a turbo molecular pump mounted below an extension of said manifold at an orientation such that there is no direct line of sight between the inlet of said pump and the point of application of the said electron beam upon the workpiece and an access door assembly mounted on said housing to provide access to gun parts mounted inside the said housing.

3. In an electron gun as in claim 1, a one piece gun housing provided with internal surfaces for piloting a cathode insulator and an anode mount so as to provide accurate alignment of electron gun components.

4. An electron gun as in claim 1, in which the said gun provides magnetic shielding for the electron beam as it passes from cathode through a hole in the anode of the gun.

5. In an electron gun as in claim 1, a cartridge body machined from a tube to a cylindrical shape, the said cartridge body machined so that its outer surface at one end fits with extremely small clearance into the above mentioned cartridge feed-through, the inside of said cartridge body machined with a circumferential groove to a depth sufficient to hold a retaining ring at a desired position inside the cartridge body against which a wave spring may take reaction.

6. In an electron beam gun as in claim 1, a mechanism for allowing rapid removal or insertion of the said cartridge head assembly (4) comprising, a cartridge feed-through (21) mounted on a cathode insulator (3), a pair of hardened steel pins (29) extending from the sides of said cartridge feed-through, (21) the said pins placed so as to fit into recesses (30) in a linear cam (31) which is attached to a cover ring (32) on said cartridge head assembly, the said linear cam being machined with 3 ramps and provided with one ball on each ramp which roll upon rotation of the cover ring (32) with respect to the cartridge body, (20) the said cartridge body provided with clearance slots (33) which are located to receive the said hardened steel pins (29) and a pair of filament current contract pins on said cartridge head assembly (4) arranged so as to be aligned with sockets (37) provided on the cartridge feed-through (21) as the cartridge head assembly is drawn into the cartridge feed-through.

7. In an electron gun as in claim 1, a bias electrode filament and filament support means, a thermally stable ceramic spacer positioned between the said filament support means and said bias electrode for maintaining the position of the said filament with respect to said bias electrode.

8. In an electron gun as in claim 1, a filament holder assembly consisting of a pair of clamps for clamping the ends of the filament, means for supporting the said clamps, insulating means for separating the clamps at a given distance from one another, each of said clamps being formed with a compliant section and an adjacent fixed section between which the ends of the filament may be inserted, means for causing the compliant section of each clamp to exert a force against the filament ends so as to secure each end of the filament to the separate clamp into which it has been inserted and means for passing current from a power supply through the separate filament clamps and through the filament so as to heat the filament to its emission temperature.

9. In an electron beam gun as in claim 1, a gun housing, a cartridge head assembly for supporting a filament holder assembly mounted within said gun housing but electrically insulated from said housing, a door to allow access to the said cartridge head assembly, means for grounding the cartridge head assembly to the gun housing when the head assembly is to be removed or inserted comprising; A plunger movable through a section of wall of the gun housing in the area of the access door, spring means for activating the plunger so that the plunger moves outwardly from said wall when door is opened, a shorting arm formed with a first long section and a second short section which is at an angle from the first section and is provided with a slot formed in the second short section and a pivot hole at a point between the two sections, a pivot mounted on the said wall about which the shorting arm is free to rotate, and a pin mounted outside and close to the end of the plunger nearest the inner side of the said wall which pin engages the slot in said shorting arm so as to cause the shorting arm to rotate about the first said pin in the wall and electrically connect the cartridge head assembly to the wall of the gun housing.

10. In an electron beam gun as in claim 1, a gun housing, a hinged door to allow access to gun elements within said gun housing, including a door handle and latching mechanism comprising; a latch block (53) fastened to a door mounting ring attached to the gun housing, the said block having a first ramp section (54) at one end which slopes outwardly and a second section starting at the end of the first ramp section which slopes inwardly, a pair of spring (55) and plunger (56) detents mounted behind the door handle arranged so balls mounted at one end of said plunger ride on said ramps when the door is being closed so as to cause the balls and pistons to ride up the ramp outwardly and cause the detent springs to be compressed to a maximum and then ride down the inwardly formed portion of the ramp so that the spring force assists in urging the door to close and seal the door to the chamber.

* * * * *